United States Patent [19]
Moore et al.

[11] Patent Number: 5,389,895
[45] Date of Patent: Feb. 14, 1995

[54] TRANSCONDUCTANCE AMPLIFIER

[75] Inventors: Paul A. Moore, Seaford; Anthony R. Cusdin, Horley, both of England

[73] Assignee: U.S. Philips Corporation, New York, N.Y.

[21] Appl. No.: 165,435

[22] Filed: Dec. 10, 1993

[30] Foreign Application Priority Data

Dec. 21, 1992 [GB] United Kingdom ............... 9226550

[51] Int. Cl.⁶ .............................................. H03F 3/45
[52] U.S. Cl. ..................................... 330/257; 330/261
[58] Field of Search ............... 330/252, 257, 258, 259, 330/261

[56] References Cited

U.S. PATENT DOCUMENTS

| | | | |
|---|---|---|---|
| 4,612,513 | 9/1986 | Seevinck | 330/261 |
| 4,779,059 | 10/1988 | Taki et al. | 330/257 |
| 4,951,003 | 8/1950 | De Jager et al. | 330/252 |

FOREIGN PATENT DOCUMENTS 0234655 9/1987 European Pat. Off. .
2195211 3/1988 United Kingdom .

*Primary Examiner*—James B. Mullins
*Attorney, Agent, or Firm*—Bernard Franzblau

[57] ABSTRACT

A transconductance amplifier comprises first and second input transistors having base electrodes to which an input voltage (Vi) is applied. A constant current source is connected to the emitters of the input transistors. Outputs are derived from their collector electrodes. A tapped impedance having two or more segments (R0 to RN,RN to R0) is connected between the base electrodes of the input transistors. The base electrodes of a plurality of further transistors are connected to respective taps of the tapped impedance. The emitter areas of these further transistors increase from each end of the tapped impedance towards the center of the tapped impedance. The emitters of the further transistors are connected to the current source and the collectors are connected to a junction which is connected to means for computing the combined base currents of the further transistors from the combined collector currents at said junction. The computed current is supplied by a current mirror circuit to the center of the tapped impedance to pull up the voltage at the center. The tapped impedance can have an increased resistance without unduly loading a preceding stage.

15 Claims, 3 Drawing Sheets

TRANSCONDUCTANCE AMPLIFIER

BACKGROUND OF THE INVENTION

The present invention relates to a transconductance amplifier for converting an input voltage into an output current. Depending on the intended application of the amplifier, the transfer characteristic between the input voltage and the output current may be linear when the circuit is used in an adjacent channel filter and may be square law when used in an automatic gain control circuit based on the sum of the squares of quadrature related signals.

Transconductance amplifiers are known per se from EP-B1-0 234 655, , which corresponds to U.S. Pat. No. 4,723,110 (Feb. 2, 1988). In a simplified form they may be regarded as a long tail pair circuit in which the control electrodes, for example, base electrodes, are interconnected by a resistor. In developments of this simple circuit, the resistor is symmetrically tapped at various points beginning at each end and proceeding to the center. Although tapping the resistor in this way increases the range of input voltages which can be handled, the problem arises that there is a practical limit to the overall value of the resistor because the higher the value of resistance, the greater the error caused by the flow of base currents. This error is small if the resistance has a relatively small value, but this resistance also forms the output load of the preceding stage so its current consumption will be higher compared to the case where the resistance has a higher value. Accordingly, a transconductance amplifier of such a design is less attractive to use in circuits for inclusion in battery powered equipment. FIG. 12 of EP-B-0 234 655 discloses a base current compensation technique which although theoretically perfect can suffer from the drawback of having to work with unacceptably small currents of the order of nanoamps so that the leakage currents of the transistors set the limit.

SUMMARY OF THE INVENTION

An object of the present invention is to increase the range of signal input voltages which can be handled by a transconductance amplifier while not increasing the overall current consumption.

According to the present invention there is provided a transconductance amplifier comprising a first and a second input transistor, each input transistor having emitter, base and collector electrodes, inputs for receiving an input voltage connected to the base electrodes of the first and second input transistors, a current source connected to the emitter electrodes of the first and second transistors, and outputs connected to the collector electrodes of the first and second transistors, a tapped impedance connected between the base electrodes of the first and second input transistors, each tap of the impedance comprising a base electrode of at least one further transistor, means connecting the emitter electrodes of the further transistors to the current source, means coupled to a collector electrode of the or at least one further transistor at each tap for computing the combined base current of the further transistors from the collector currents of the or at least one further transistor at each tap and for supplying without distribution a current corresponding to the total base currents of all the further transistors to a central point of the tapped impedance.

By accurately compensating for the error(s) at the centre of the tapped impedance and less precisely compensating for errors at other taps between the centre and the ends of the tapped impedance using current which was previously lost to the positive rail, it is possible to increase the value of the tapped impedance tenfold before the errors which exist become so large as to be unacceptable. However, not only has the range of input signal voltages been extended but also the loading by the transconductance amplifier on the preceding stage is within acceptable limits.

In the case where there is only one further transistor at each tap, the total of the collector currents is used to compute the combined base current which is duplicated and supplied to the central point of the tapped impedance.

In certain situations a fraction of the collector current of the further transistors, which in the known circuits was wasted, is used for another purpose leaving the balance or remaining fraction of the collector current to be used for compensating for errors. The remaining fraction is used to compute a corresponding fraction of the combined base current of all the further transistors which base current is multiplied by the reciprocal of said remaining fraction to obtain substantially the total base current which is supplied to the central point. In order to obtain fractions of the currents at each tap at least two further transistors are provided with the ratio of the emitter areas at each tap being the same.

If desired, a current mirror may be used to duplicate or provide the current supplied to the central point.

BRIEF DESCRIPTION OF THE DRAWINGS

The present invention will now be described, by way of example, with reference to the accompanying drawings, wherein.

In the drawings the same reference numerals have been used to indicate corresponding elements.

DESCRIPTION OF THE PREFERRED EMBODIMENTS

Figure 1:
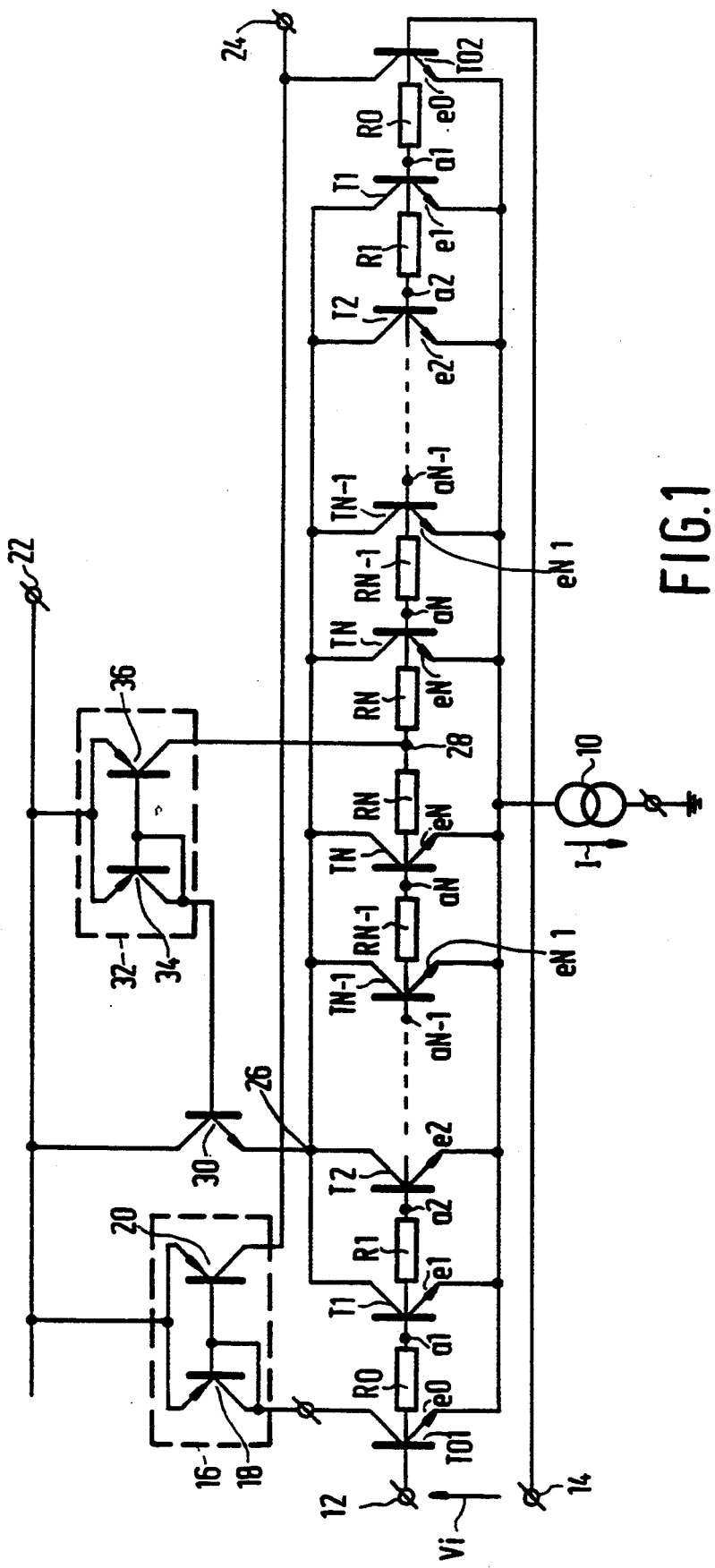
FIG. 1 is a schematic circuit diagram of an embodiment of a class-AB linear transconductance amplifier made in accordance with the present invention.

Referring to FIG. 1, the transconductance amplifier circuit comprises NPN input transistors T01 and T02 having emitter areas e0. Emitter electrodes of these transistors are connected to a constant current source 10. An input signal is applied to terminals 12,14 connected respectively to base electrodes of the transistors T01,T02. The collector electrodes of the transistors T01,T02 provide a differential output. The difference between the collector currents of the transistors T01,T02 can be obtained by means of a differential to single ended converter circuit 16 comprising PNP transistors 18,20. The emitter electrodes of the transistors 18,20 are connected together and the junction is connected to the positive supply line 22. The base electrodes of these two transistors are connected together and the base electrode of the transistor 18 is connected to its collector electrode which in turn is connected to the collector electrode of the transistor T01. The collector electrode of the transistor 20 is connected to the collector electrode of the transistor T02 from which a single ended output is derived on a terminal 24.

A voltage divider formed by a tapped impedance, sometimes termed the base line resistor, is connected between the base electrodes of the transistors T01,T02. The tapping of the impedance is such that beginning from the base electrodes of the input transistors T01,T02 and progressing to the centre 28, segments R0 to RN and RN to R0 of the impedance symmetrically increase in resistance value towards the centre.

Junction points a1 to aN and aN to a1 are connected respectively to base electrodes of NPN transistors T1 to TN and TN to T1. The emitter areas ek, where k=1 to N, of these transistors increase symmetrically towards the centre.

For each value N, the ratio between the emitter areas ek, where k=0 ... N, of the transistors T01,T1 ... TN,TN ... T1,T02 and the ratio between the resistance values Wk, where k=0 to N, of the segments R0 to RN,RN to R0 can be selected in such a way that the difference between the collector currents of the transistors T01 and T02 has a linear relationship to the input voltage Vi over an as large as possible range.

The emitter electrodes of these transistors T1 to TN and TN to T1 are connected jointly to the constant current source 10. The collector electrodes of the transistors T1 to TN and TN to T1 are connected to a junction 26 at which the collector currents are summed.

The collector current at the junction 26 is used to provide compensation for the voltage drop which normally occurs at the centre 28 of the tapped resistor due to the currents flowing through the base electrodes of the transistors T1 to TN and TN to T1. The compensating current is designed to compensate substantially for the voltage drop at the centre 28 of the tapped impedance relative to its ends. The actual voltage drop varies as a result of the actual proportion of the current I flowing through the tapped impedance relative to that flowing through the transistors T01 and T02.

In the quiescent state, the transistors T1 to TN and TN to T1 drain a part of the current I from the current source 10, so that the bias current through the transistors T01 and T02 is only a fraction of the current I. As the input voltage Vi increases the sum of the currents flowing in the transistors T1 to TN and TN to T1 comprises an increasingly smaller part of the current I, so that the bias current through one of the transistors T01 and T02 increases.

The current at the junction 26 is coupled to a NPN transistor 30 which computes the combined base currents of the transistors T1 to TN and TN to T1 from the combined collector currents of these transistors at the junction 26. The base electrode of the transistor 30 is connected to a current mirror circuit 32 which duplicates the combined base currents and supplies this current without distribution to the junction 28. The current mirror circuit 32 comprises PNP transistors 34,36 whose emitter electrodes are jointly connected to the positive supply line 22. The base electrodes are joined together with a further connection from the common connection to the collector electrode of the transistor 34. The collector electrode of the transistor 36 is connected to the junction 28. In the embodiment illustrated the emitter areas of the transistors 34,36 are equal.

The effect of applying this form of current compensation to the transconductance amplifier is to make any errors tolerable. Consequently the resistance value of the tapped impedance or base line resistor can be increased, for example, by a factor of 10 before the inherent errors in the circuit are unacceptable. However, increasing the value of the tapped impedance or base line resistor reduces the load on the preceding stage thereby decreasing its current drain.

Figure 2:
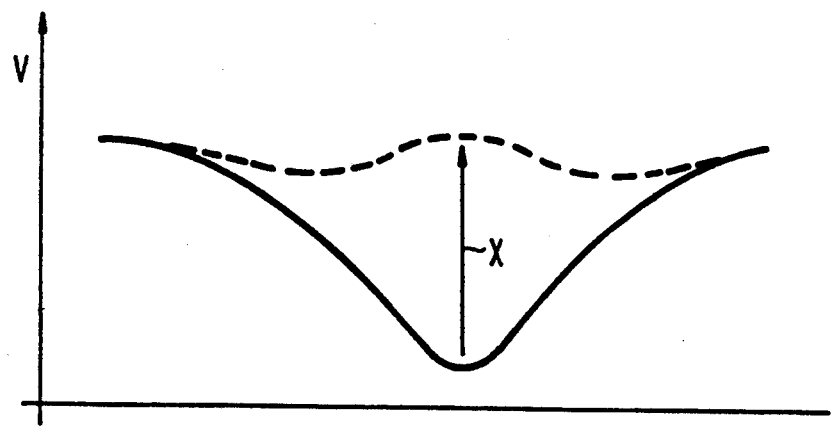
FIG. 2 is a graph illustrating the typical voltage along the tapped impedance in the quiescent state.

FIG. 2 illustrates in full lines the variation of the voltage along the tapped impedance or base line resistor without the current being fed to the junction 28 and in broken lines the approximate voltage distribution achieved by "pulling-up" the voltage at the junction 28 as indicated by the arrow X.

Figure 3:
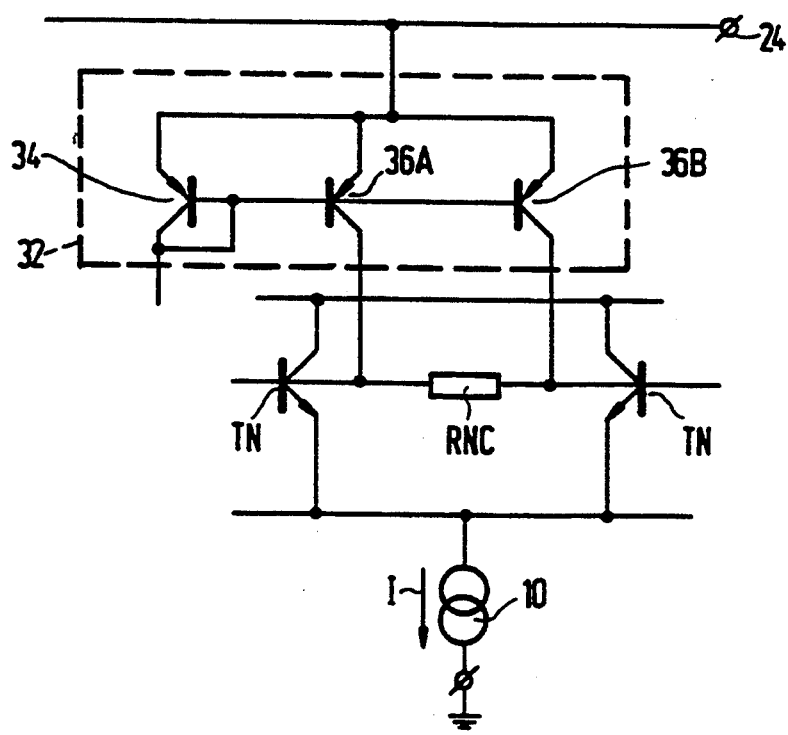
FIG. 3 is a schematic diagram of a part of a class-AB linear transconductance amplifier having an impedance at the center of the tapped impedance.

FIG. 3 illustrates a variant of the current mirror circuit 32 in order to cope with the tapped impedance having an odd number of elements and as a result having a single central resistance element RNC with a resistance value of 2N. Compared to FIG. 1, the transistor 36 either comprises two transistors 36A,36B or has two collector electrodes, with the collector electrodes being connected to either side of the resistance element RNC. When the transistor 36 comprises two transistors 36A,36B the emitter areas of the transistors 34 and 36 are scaled such that the current flowing in the transistor 36A equals the current flowing in the transistor 36B which current equals half the current flowing in the transistor 34. In the alternative arrangement of the transistor 36 having two collectors the current flowing in each collector contact of the transistor 36 equals half the current flowing in the transistor 34.

Figure 4:
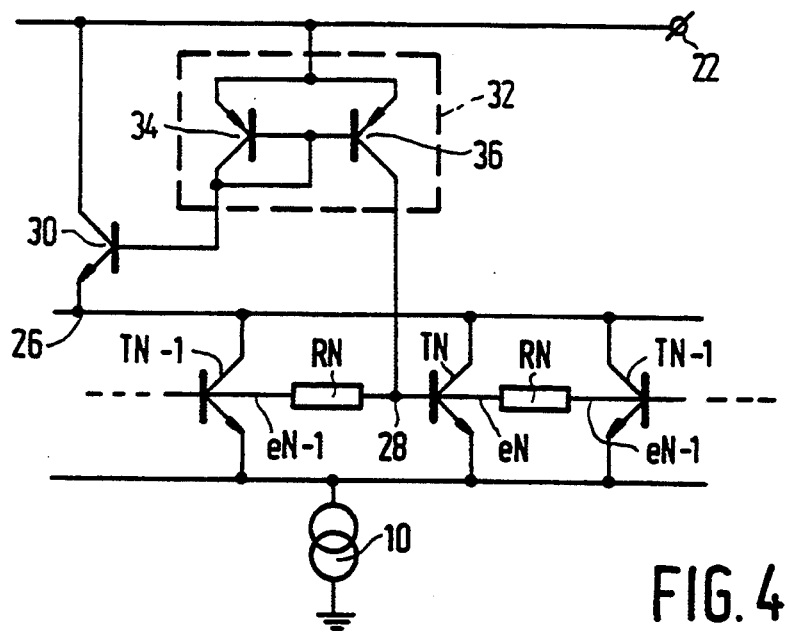
FIG. 4 is a schematic diagram of a part of a class AB linear transconductance amplifier having a transistor at the centre of the tapped impedance.

FIG. 4 illustrates another variant of the transconductance amplifier to that shown in FIG. 1 in which there are an odd number of transistors. In FIG. 4 the tap at the centre 28 of the tapped impedance is connected to the base electrode of a transistor TN having an emitter area eN. The emitter electrode of this transistor is connected to the current source 10 and the collector electrode is connected to the junction 26. The operation of the circuit is as described with reference to FIG. 1.

Figure 5:
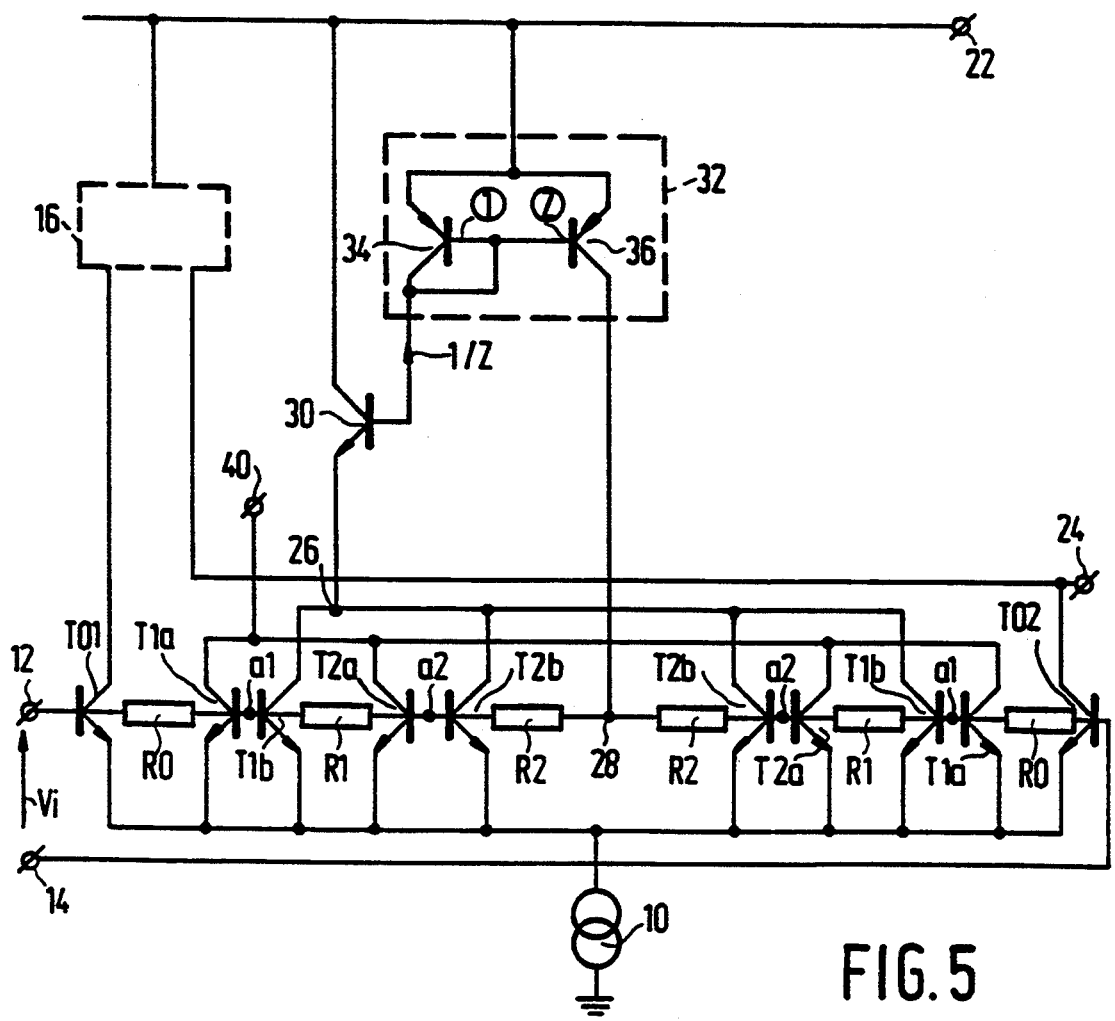
FIG. 5 is a schematic diagram of a class AB linear transconductance amplifier in which only a fraction of the combined collector currents is used to compute the current fed back.

FIG. 5 illustrates a transconductance amplifier in which a fraction 1/Z of the combined collector current is used to provide the base current compensation while the remaining current is used for some other (unspecified) function. At each of the junction points or taps a1,a2, a2 and a1 of the tapped impedance, pairs of NPN transistors T1a,T1b; T2a,T2b; T2b,T2a and T1b and T1a are provided. The emitter areas of the pairs of transistors are equal but the combined emitter areas at successive taps vary in the manner described with reference to FIG. 1. The emitter electrodes of all these pairs of transistors are connected to the current source 10. The collector electrodes of the transistors T1a,T2a, T2a and T1a are connected to a terminal 40 from where the current can be supplied for some other use. The collector electrodes of the transistors T1b,T2b, T2b and T1b are connected to the junction 26. In this example the current at the junction 26 will be 50 per cent (or 1/Z, where Z=2) of that which is present in the embodiment shown in FIG. 1. In order to compensate for the combined base currents, the current mirror circuit is arranged to multiply the current computed by the transistor 30 by Z, where Z=2, and to supply the current to the junction 28. This multiplication by Z can be effected by either the emitter area of the transistor 36 being Z times that of the transistor 34 or the transistor 36 comprising Z parallel connected transistors each having the same emitter area as the transistor 34.

It is possible for the emitter areas of each pair of the transistors T1a,T1b; T2a,T2b; T2b,T2a and T1b,T1a to be unequal but in the same ratio 1/Z, where Z has any suitable value, including non-integer values. However, once the value of Z has been determined then the multiplication by the transistor 36, however configured, is set.

From reading the present disclosure, other modifications will be apparent to persons skilled in the art. Such modifications may involve other features which are already known in the design, manufacture and use of transconductance amplifiers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

We claim:

1. A transconductance amplifier comprising a first and a second input transistor, each input transistor having emitter, base and collector electrodes, input means for receiving an input voltage and connected to the base electrodes of the first and second input transistors, a current source connected to the emitter electrodes of the first and second transistors, and outputs connected to the collector electrodes of the first and second transistors, a tapped impedance connected between the base electrodes of the first and second input transistors, each tap of the impedance comprising a base electrode of at least one further transistor having an emitter electrode, means connecting the emitter electrodes of the further transistors to the current source, means coupled to a collector electrode of or at least one further transistor at each tap for computing the combined base current of the further transistors from the collector currents of the at least one further transistor at each tap and for supplying without distribution a current corresponding to the total base currents of all the further transistors to a central point of the tapped impedance.

2. A transconductance amplifier as claimed in claim 1, wherein at least two further transistors are provided at each tap of the impedance, in that the ratio of the emitter areas of the at least two further transistors at each tap is the same, and the collectors of those further transistors having substantially the same fraction of collector currents are combined and supplied to said means for computing the combined base currents of said further transistors.

3. A transconductance amplifier as claimed in claim 2, wherein said means comprises a transistor of the same conductivity type as said further transistors, and the means for computing for supplying the collector currents of the at least one further transistor at each tap includes a current mirror circuit having a current input connected to the base of the transistor and a current output connected to the central point of the tapped impedance.

4. A transconductance amplifier as claimed in claim 3, the transistor computes a fraction 1/Z of the total base currents of the further transistors and supplies it to the current mirror which is arranged to multiply by the reciprocal of said fraction and to supply a current corresponding to substantially the total base currents of all the further transistors to said central point.

5. A transconductance amplifier as claimed in claim 1, wherein said means for computing comprises a transistor of the same conductivity type as said further transistors, and the means for supplying the collector currents of the at least one further transistor at each tap includes a current mirror circuit having a current input connected to the base of the transistor and a current output connected to the central point of the tapped impedance.

6. A transconductance amplifier as claimed in claim 5, comprising at least two further transistors at each tap, wherein the transistor computes a fraction 1/Z of the total base currents of the further transistors and supplies it to the current mirror which is arranged to multiply by the reciprocal of said fraction and to supply a current corresponding to substantially the total base currents of all the further transistors to said central point.

7. A transconductance amplifier comprising:
first and second input terminals for an input signal voltage,
a current source,
first and second input transistors each having a control electrode and first and second main electrodes,
first means coupling the second main electrodes of said first and second input transistors to said current source,
an output terminal coupled to the first main electrodes of the first and second input transistors,
second means coupling said first and second input terminals to respective control electrodes of the first and second input transistors,
a plurality of further transistors each having a control electrode and first and second main electrodes,
a tapped impedance coupled between the control electrodes of the first and second input transistors and with each tap of the tapped impedance coupled to a respective control electrode of a respective further transistor,
a common circuit node coupled to the first main electrodes of the further transistors,
third means coupling the second main electrodes of the further transistors to said current source,
means coupled to said common circuit node for computing the total control electrode currents of the further transistors from currents flowing in the first main electrodes of the further transistors, and
means for supplying to a center point of the tapped impedance a compensation current corresponding to the total control electrode currents of the further transistors.

8. The transconductance amplifier as claimed in claim 7 wherein said further transistors comprise bipolar NPN transistors wherein emitters of the NPN transistors comprise said second main electrodes of the further transistors, and the emitter areas of the further transistors increase from each end of the tapped impedance to said center point thereof.

9. The transconductance amplifier as claimed in claim 7 wherein said compensation current supplying means comprises a current mirror circuit having an output coupled to said center point of the tapped impedance whereby the compensation current pulls up the voltage at said center point.

10. The transconductance amplifier as claimed in claim 7 wherein said further transistors comprise bipolar transistors and said means for computing comprises a third transistor of the same conductivity type as said further transistors and coupled to said common circuit node, and a current mirror circuit having a current input coupled to the base of the third transistor and a current output coupled to said center point of the tapped impedance for supplying it with said compensation current.

11. The transconductance amplifier as claimed in claim 7 further comprising:
   first and second supply voltage rails, and wherein said first coupling means couples said first and second input transistors in first and second series circuits with said current source to said first and second supply voltage rails.

12. The transconductance amplifier as claimed in claim 7 further comprising:
   a current mirror circuit having first and second terminals coupled to the first main electrodes of the first and second input transistors, respectively, and a third common terminal coupled to a supply voltage terminal for the transconductance amplifier.

13. The transconductance amplifier as claimed in claim 12 wherein said means for computing comprises a third transistor coupled to said common circuit node and to a supply voltage terminal for the transconductance amplifier, and
   a second current mirror circuit having a current input coupled to a control electrode of the third transistor and a current output coupled to said center point of the tapped impedance for supplying it with said compensation current.

14. The transconductance amplifier as claimed in claim 7 wherein said further transistors comprise bipolar NPN transistors wherein emitters of the NPN transistors comprise said second main electrodes of the further transistors, and wherein
   at least two further transistors are provided at each tap of the impedance, in that the ratio of the emitter areas of the at least two further transistors at each tap is the same, and the collectors of said further transistors having substantially the same fraction of collector currents are combined and supplied to said means for computing the combined control electrode currents of said further transistors.

15. The transconductance amplifier as claimed in claim 14 wherein;
   said means for computing comprises a third transistor coupled to said common circuit node, and a current mirror circuit having a current input coupled to a control electrode of the third transistor and a current output coupled to said center point of the tapped impedance for supplying it with said compensation current, and
   the third transistor computes a fraction 1/Z of the total control electrode currents of the further transistors and supplies it to the current mirror circuit which is arranged to multiply by the reciprocal of said fraction and to supply a compensation current corresponding to substantially the total control electrode currents of the further transistors to said central point of the tapped impedance.

* * * * *